(12) United States Patent
Mallinson

(10) Patent No.: US 8,937,991 B2
(45) Date of Patent: Jan. 20, 2015

(54) FIR FILTER USING UNCLOCKED DELAY ELEMENTS

(71) Applicant: ESS Technology, Inc., Fremont, CA (US)

(72) Inventor: A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 14/055,785

(22) Filed: Oct. 16, 2013

(65) Prior Publication Data

US 2014/0105269 A1    Apr. 17, 2014

Related U.S. Application Data

(60) Provisional application No. 61/715,250, filed on Oct. 17, 2012.

(51) Int. Cl.
   *H03K 5/159*   (2006.01)
   *H04L 25/49*   (2006.01)
   *H03H 17/06*   (2006.01)
   *H03H 17/02*   (2006.01)

(52) U.S. Cl.
   CPC ........... *H04L 25/4902* (2013.01); *H03H 17/06* (2013.01); *H03H 17/0213* (2013.01)
   USPC .......................................................... 375/229

(58) Field of Classification Search
   USPC .................................................. 375/229, 238
   See application file for complete search history.

(56) References Cited

U.S. PATENT DOCUMENTS

| | | | | |
|---|---|---|---|---|
| 2008/0143402 A1* | 6/2008 | Huang et al. | ................... | 327/158 |
| 2009/0066382 A1* | 3/2009 | Yousefzadeh et al. | ........ | 327/175 |
| 2009/0220028 A1* | 9/2009 | Warren | .......................... | 375/316 |
| 2011/0291730 A1* | 12/2011 | Ahn et al. | ...................... | 327/276 |

* cited by examiner

*Primary Examiner* — Don N Vo
(74) *Attorney, Agent, or Firm* — Gard & Kaslow LLP

(57) ABSTRACT

A system and method for filtering an analog signal with a finite impulse response (FIR) filter that does not require analog delay elements are disclosed. An analog signal is pulse-width encoded, and the pulse-width encoded signal passed to a delay line comprising unclocked delay elements, such as logic gates, rather than clocked delay elements such as are used in conventional FIR filters. The propagation of the input signal is thus due only to the delay inherent in each gate, and occurs based upon when a signal reaches the gate rather than being caused by a clock signal. As with a conventional FIR filter, weighting elements having impedance are used to weigh the output of each delay element, and the resulting outputs summed to obtain a filtered output signal. For certain signals, such a circuit and method provides a simpler way of filtering than conventional filters.

9 Claims, 3 Drawing Sheets

FIR FILTER USING UNCLOCKED DELAY ELEMENTS

This application claims priority from Provisional Application No. 61/715,250, filed Oct. 17, 2012, which is incorporated by reference herein in its entirety.

FIELD OF THE INVENTION

The present invention relates generally to electronic filters, and more particularly to finite impulse response (FIR) filters.

BACKGROUND OF THE INVENTION

Analog filters having well-defined and steep transition bands (the range of frequencies where the filter goes from passing the signal to blocking the signal) can be complex and costly. The components of such filters may be hard to match, particularly on a single silicon chip because the transfer function, as represented in a pole-zero analysis, requires many poles and/or zeros which must all match. As the filler order increases, i.e., as more poles and zeros are required, the Q of the filter (the bandwidth relative to the center frequency) typically increases, and high-Q circuits require low noise and high dynamic range.

Some such analog applications, for example a band limiting filter such as a television channel select filter (CSF), may be commonly done with an expensive surface acoustic wave (SAW) device. However, such devices may have reliability issues due to the need to interconnect from the SAW device to a silicon chip, as well as insertion losses, which typically require a high performance amplifier to compensate. Thus, alternatives have been sought to such complex analog filters.

One technique that is common in digital signal processing is a finite impulse response (FIR) filter, which is well known in the prior art. One type of FIR filter is a transversal filter, or tapped delay line filter, as shown in FIG. 1. The output of such a filter is a weighted combination of voltages taken from uniformly spaced taps, and thus a weighted sum of the current input value and a finite number of previous values of the input. The output is proportional to the sum of the delayed voltages divided by the resistances connected to the respective voltages. The proportionality of the output is thus a constant, the constant being the parallel impedance of all the resistances.

The filter contains a plurality (here 7 are shown) of unit delay elements U1 to U7, each of which introduces a delay of time t. Delay elements U1 to U7 are all clocked by the same clock, so that the input signal propagates at a desired sampling rate. The filter is considered to be of the Mth order, where M−1 is the number of delay elements, so the filter of FIG. 1 is an $8^{th}$ order filter. The output of each of the delay elements U1 to U7 is connected to an element having impedance, here shown as a resistor R1 to R7, typically through some buffering means, such as buffers Z1 to Z7. The resistors all share a common output point. (Other elements having impedance may be used rather than resistors, such as for example, capacitors or inductors.)

As an input signal $S_n$ progresses through the delay elements, its contribution to the output voltage varies in time; each resistor causes the signal on the respective delay element to which it is attached to contribute to the output signal in inverse proportion to the resistor value. Thus, if the resistor is small, the signal on the attached delay element will have a large contribution to the output voltage, while if the resistor is large the contribution to the output will be smaller.

It is well known that the basis of a FIR filter is the mathematics of Fourier transforms. By properly selecting the resistor values in a set of resistors as the inverse of a set of Fourier coefficients that is calculated to provide a desired frequency response, a FIR filter is designed to provide an output with that response. The resistor values are typically calculated by a software program which takes the desired frequency response as an input.

The output of a FIR filter is thus generally characterized, by the expression:

$$Out = \sum_{i=0}^{W} In_i * W_i$$

where N is the number of elements in the filter, the values of Wi represent the set of weighting factors implemented by the resistors, and the values of Ini represent a series of delayed versions of the input signal.

In a typical FIR filter, the delay between each value of Ini may be, for example, 1 nanosecond (nS), and the filter may consist of, for example, 30 elements or more. However, this a broad generalization, and there are many variations of both the delay time and the number of elements that are known to those of skill in the art.

The values of Wi and Ini may be continuous, i.e., analog quantities, or may be quantized, i.e., digital or digitally encoded quantities. However, one limitation on an "all analog" FIR filter is the delay elements: although a transmission line is an easy way to implement such delay elements, such a line is impractical to implement on a silicon chip.

One way to avoid this limitation is to use a digital representation of the input signal, i.e., to use values of Ini that are digital quantities which may be easily delayed in a logic circuit; the precise analog signal is not important since all that is necessary to encode a digital signal is whether the signal is high or low relative to some threshold and thus results in a 1 or a 0. A FIR filter built in this way, where the values of to are digital and the values of Wi are analog, is commonly referred to as a semi-analog FIR filter.

A semi-analog FIR filter is advantageous since it replaces the delay elements that would need to be analog-in and analog-out with clocked digital delay elements. Such digital delay elements impose two degrees of quantization on the analog signal. First, since the delay elements are clocked, they can only change state on the clock edge, and events are therefore now quantized to the timing edges of the clock. Second, being digital elements, the values of amplitude of their outputs are now just 0 or 1, rather than the original analog qualities. This may be contrasted to a transmission line: a delay line constructed from a transmission line can pass any signal amplitude and can make an output transition between continuous levels at any time.

A semi-analog FIR filter thus has the benefit of a digital delay line, and is thus practical to build on a silicon chip. The delay elements may, for example, be clocked D-flip-flops (DFFs) where the delay time is defined by a common clock, or simply logic gates in which the delay time is the logic gate transition time (known as the "gate delay").

Using such a semi-analog FIR filter allows any signal that may be conveniently represented in a digital form to be processed by the filter. For example, a square wave signal at 100 megahertz (MHz) may be fed into a delay line consisting of logic gates and the output of the gates summed with the appropriate weighting to make an analog output, and, with the appropriate weightings of Wi, may even generate an analog sine wave from the digital square wave.

One particular group of signals that are often used with a semi-analog FIR filter are those generated by a sigma-delta (ΣΔ) modulator. A ΣΔ modulator creates a sequence of digital signals that change only at specific times, i.e., on the edges of an input clock to the ΣΔ modulator. Such a sequence of digital signals may be easily applied to a semi-analog FIR filter having either a DFF or gate-delay based delay line. The use of a ΣΔ modulator is convenient since it is a device that quantizes the analog signal at its input in both amplitude (0 or 1) and time (the edges of its clock). Since the ΣΔ modulator renders the analog signal into a quantized-in-amplitude and quantized-in-time signal, it is not a trivial matter to apply the resulting signal to the semi-analog FIR filter with delay elements that are clocked at the same rate as the ΣΔ modulator clock.

Since the combination of a ΣΔ modulator and semi-analog FIR filter may accept an analog signal, generate an intermediate digital pulse stream, delay that pulse stream in a simple digital delay line, and then sum the weighted signals to create an analog output, this allows for an analog-in to analog-out filter. The commercial value of such a filter is significant, in that a band-limiting filter constructed from SAW devices may be replaced by a combined ΣΔ modulator and semi-analog FIR filter and implemented on a silicon chip. This reduces cost and increases reliability, since no interconnection from a chip to a SAW is required. Further, the insertion losses that are commonly associated with SAW filters are not present.

But ΣΔ modulators have their own issues. A ΣΔ modulator is a system that exploits "noise shaping" and works because the quantization noise present in the digital output stream is removed from the frequency band of interest. For example, a signal of 20 hertz to 20 kilohertz (1 KHz) may be encoded by a ΣΔ modulator operating with a 1.5 MHz clock. Since the clock is at a much higher frequency than the highest signal of interest, the noise may be moved (i.e., "noise shaped") out of the audio band of 20 Hz to 20 KHz and placed in a higher frequency band near the clock frequency.

Such a ΣΔ modulator is called a "low pass" ΣΔ modulator since the noise below a small fraction of the clock is removed, and in the low frequency band of interest signals will thus be represented with insignificant noise in the output pulse stream. The ratio of the clock to the highest signal of interest (here 1.5 MHz to 20 KHz, or about 750 to 1) is referred to as the oversampling ratio (OSR). Oversampling ratios of 100 and higher are typical.

Other types of ΣΔ modulators exist as well. By carefully choosing the filter in the noise shaping loop of the ΣΔ modulator it is possible to make a "band pass" ΣΔ modulator, in which noise is moved out of a band of interest to regions both above and below the desired signal. For example, in a television application, a ΣΔ modulator clocked at 1 gigahertz (GHz) may be used to remove noise in the range of 40 MHz to 48 MHz, and move it to the lower (0 to 40 MHz) and upper (48 MHz to 500 MHz) regions. In this case the OSR is only about 20 to 1 (1 GHz to 48 MHz). This is one benefit of band-pass ΣΔ modulators: the clock is not as much higher in frequency than the signal of interest, and the clock is thus easier to construct.

Band pass ΣΔ modulators are technically viable, and such a ΣΔ modulator might be used with a semi-analog FIR filter in the TV CSF above, rather than a more costly SAW filter. A band pass ΣΔ modulator is needed because a low pass ΣΔ modulator would need to be clocked at about 5 GHz or more to oversample a 40 MHz television signal. While this is not too fast for a clock, it is too fast for the filter, which must be analog and must operate with accuracy of about one part in 1000.

However, such a band-pass ΣΔ modulator demands a precision filter in its noise shaping loop. Thus, a CSF based on a band-pass ΣΔ modulator and a semi-analog FIR filter may become just as complex and costly as a more conventional CSF built with high order analog filter components or with SAW devices, and thus may not be commercially viable.

It would thus be advantageous to be able to implement a semi-analog FIR filter, for example on a silicon chip, without the use of a complex ΣΔ modulator or a complex filter.

SUMMARY OF THE INVENTION

A method and system is disclosed for designing finite impulse response (FIR) filters that use unclocked digital delay elements, and are thus capable of operating as analog-in/analog-out filters having a quantization in the delay line of amplitude, but nut having a quantization in the delay line in time. The unclocked digital delay is used to process an analog representation of a signal that has been derived from a pulse-width-modulator, which is considerably simpler to implement than a ΣΔ modulator.

One embodiment describes an apparatus for filtering an analog signal, comprising: a pulse width encoder configured to receive an analog input signal and convert it into a continuous time pulse-width encoded signal; a delay line comprising a plurality of unclocked delay elements in series and connected to the pulse-width encoder for propagating the pulse-width encoded signal; a plurality of buffers, each buffer in the plurality of buffers coupled to receive the delayed pulse-width encoded signal after the pulse-width encoded signal has passed through a separate one of the plurality of delay elements; and a plurality of elements having impedance values, each of the plurality of elements connected to a separate one of the plurality of buffers an impedance value such that the sum of the outputs of the plurality of elements produces a desired frequency response to the pulse-width encoded signal.

Another embodiment describes a method of filtering an analog signal, comprising: converting the analog signal into a continuous time pulse-width encoded signal; passing the pulse-width encoded signal down a delay line comprising a plurality of unclocked delay elements; passing the delayed pulse-width encoded signal through a set of elements having impedance values, a separate dement connected to the delay line after each delay element, the impedance values corresponding to a plurality of Fourier coefficients that result in the desired frequency response to the input signal; and summing the passed pulse-width encoded signal from each of the elements to obtain an output signal.

DETAILED DESCRIPTION OF THE INVENTION

The present application describes a finite impulse response (FIR) filter using unclocked delay elements, rather than clocked analog delay elements. Like a conventional FIR filter, such a filter accepts an analog signal and produces an analog signal, but provides a simpler way of filtering certain analog signals than conventional filters.

The delay elements of a filter according to the present application are unclocked, such as logic gates which have a propagation delay but do not require or use clocking, rather than clocked delay elements such as DFFs or other clocked elements that are used in conventional FIR filters. The propagation of the input signal is thus due only to the delay inherent in each gate, and occurs based upon when a signal reaches the gate rather than being caused, by a clock signal.

The logic gates do not act as sampling devices as in a conventional FIR filter, and thus the input analog signal must be converted, to a digital signal before it is applied to the delay line. This is accomplished by a pulse width encoder (PWE; sometimes also called a pulse width modulator or PWM), which encodes an input analog signal into a continuous time pulse-width encoded quantity, in one embodiment, the PWE is what is known as a self-oscillating PWE.

Self-oscillating PWEs are known in the art. For example, U.S. Pat. Nos. 6,753,729 and 7,221,216 describe such circuits. Such a PWE behaves in one key respect like a $\Sigma\Delta$ modulator, i.e., it encodes an input analog signal into a digital signal. However, unlike a $\Sigma\Delta$ modulator, a PWE does not attempt to quantize the output signal in time; rather, it allows the output signal to change at any arbitrary time.

While removing the necessity of quantizing in time makes the PWE significantly simpler than a $\Sigma\Delta$ modulator, it also generally makes the PWE less useful, since the PWE changes the analog amplitude of its input into the analog position of its output edges. In some sense, the PWE is thus not converting an analog input into a digital output at all, but rather is simply moving the analog quantity of the input from one represented by amplitude voltage) to one represented by time.

Thus, a PWE is not useful as an analog-to-digital converter (ADC) since any attempt to do so will face a difficult problem in finding the precise time at which the PWE output has changed, a task at least as difficult, if not more so, than finding the input amplitude.

It is known in the prior art to filter the unclocked pulses of a. PWE to recreate an analog signal which was converted into those pulses. Glass D audio amplifiers operate by feeding the output of a PWE to an LC filter (one composed of one or more inductors and capacitors) to recreate an audio signal.

Figure 1:
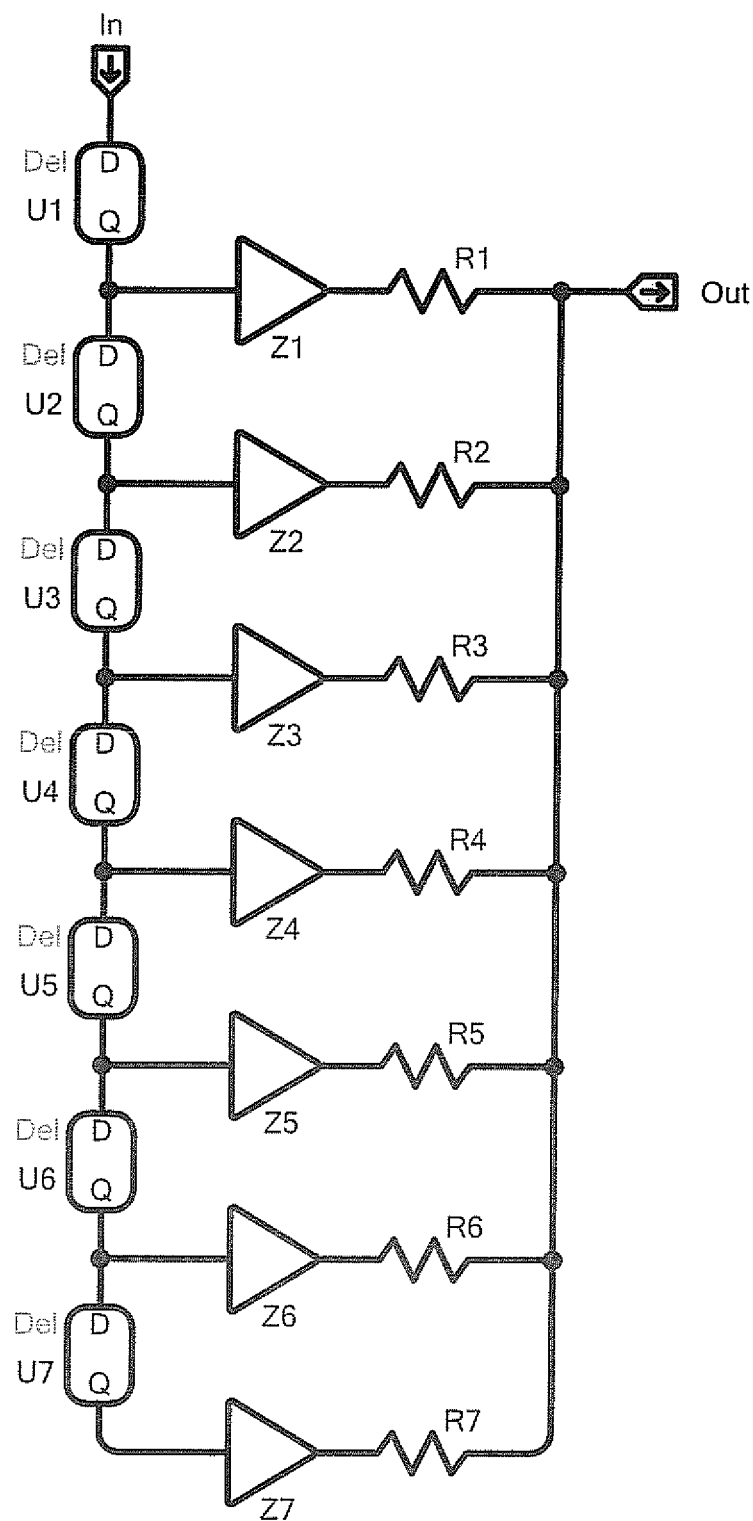
FIG. 1 is a schematic diagram of a finite impulse response (FIR) filter as known in the art.

In the present embodiment, instead of sending the pulses from the PWE to an LC filter, the pulses are sent to the digital delay line of a "gate-delay" type FIR filter such as is shown in FIG. 1, in which the delay elements U1 to U7 are logic gates. Unlike a DFF-type FIR filter, the delay elements of such a delay line are unclocked.

The output transitions of the PWE are unconstrained and may occur at any time. Similarly, the input-to-output delay of each gate (delay element) in the FIR filter may also occur at any time (again since the gates are unclocked). As with a conventional FIR filter, the outputs of the resistors (weighting elements) are summed to create the output, and, as above, with proper weightings that output may be an analog signal. Since the PWE operates on an input signal, the result is again an analog-in to analog-out filter.

Figure 2:
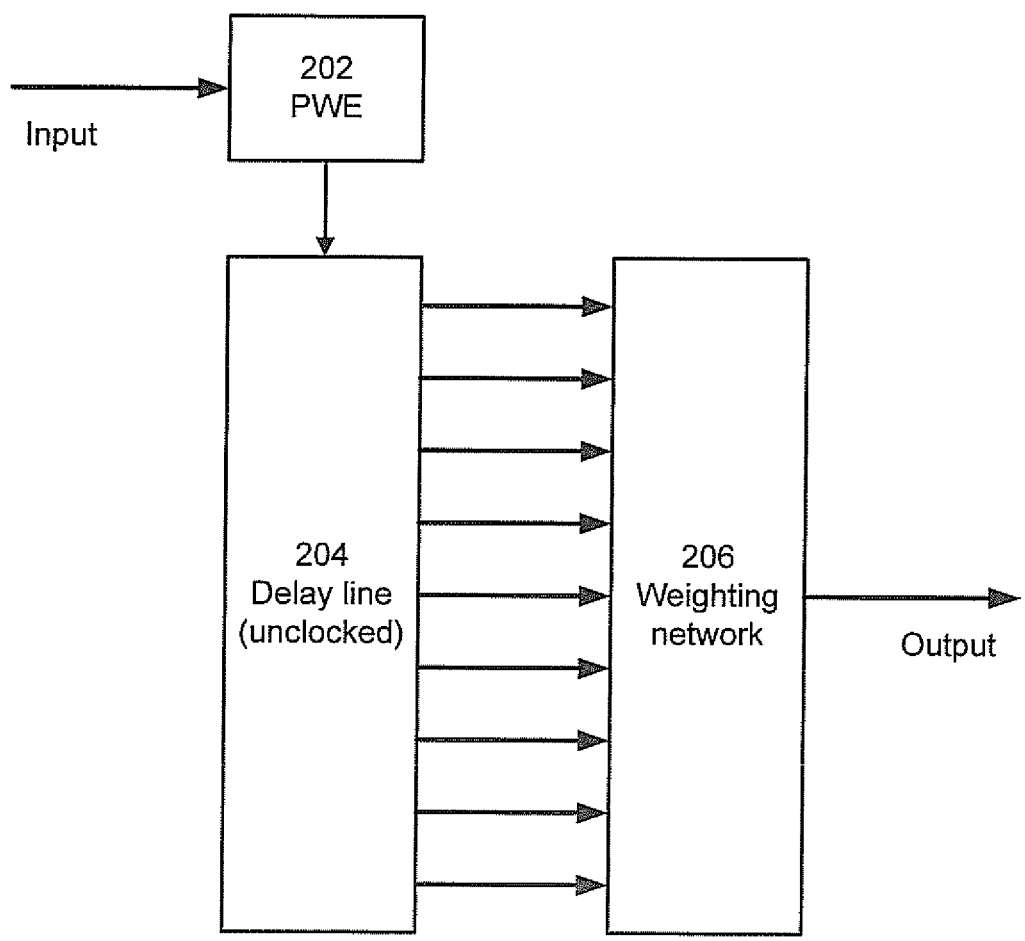
FIG. 2 is a block diagram of a FIR filter that does not require analog delay elements according to one embodiment.

FIG. 2 shows a block diagram of a filter 200 constructed according to one embodiment of this approach. An analog input signal is applied, to a PWE 202. The resulting pulse-width encoded output, a series of pulses occurring on arbitrary boundaries, is fed to a delay line 204 of unclocked digital delay elements. The outputs of the delay line 204 is in turn fed to a weighting network 206 of weighting elements, and the outputs of the network 206 are summed together to create the analog output signal. Again, the delay line 204 and network 206 of weighting elements may look, for example, like those shown in the conventional FIR filter of FIG. 1, with the caveat mentioned above that the delay elements must be unclocked, for example logic gates, and not clocked elements such as DFFs. (The number of weighting elements, and thus the order of the filter, may of course also be different.)

Because the delay elements are unclocked and provide a fixed delay (again the gate delay of each logic gate), the relative timing of the input pulses is preserved. With the proper weighting elements, the output will again appear to be a continuous analog signal. However, there will be a relatively large delay from the input signal to the output signal due to the delay line. This delay may be as much as 4 or 5 times as great at a given frequency as that of a conventional analog filter, which typically has a low delay time.

It should also be noted that the above discussion assumes that each logic gate has an equal delay from each positive edge of the input signal to the next, and from each negative edge to the next, so that there is no pulse width distortion. Pulse width distortion is an effect that results from a delay element typically having a slightly different delay when processing a positive edge than the delay when processing a negative edge. For example, in processing a rising or positive edge, a particular delay element may produce a signal having a delay of 101 picoseconds (ps), while in processing a falling or negative edge the same delay element may result in a delay of only 99 ps. (Such a delay element would typically be considered to have a nominal value of a 100 ps delay.)

If a pulse with a width of 1 nanosecond (ns) is passed down a delay line having 100 delay elements with these specifications, a positive edge will appear at the output 10.1 ns after it is input (i.e., 101 ps times 100 delay elements), while a negative edge will arrive 9.9 ns after it is input (i.e., 99 ps times 100 delay elements). In this case, the input pulse of 1 ns width will appear at the output as a pulse having a width of only 800 ps, due to the relative arrival of the edges.

As is understood by those of skill in the art, in practice there is typically some pulse width distortion because the gates will not be absolutely uniform. However, such distortion will only affect the output if the variations in gate delay become large enough that an entire pulse disappears. The circuit will function as expected as long as the variations remain small enough that all of the pulses are delayed in sequence and weighted.

Figure 3:
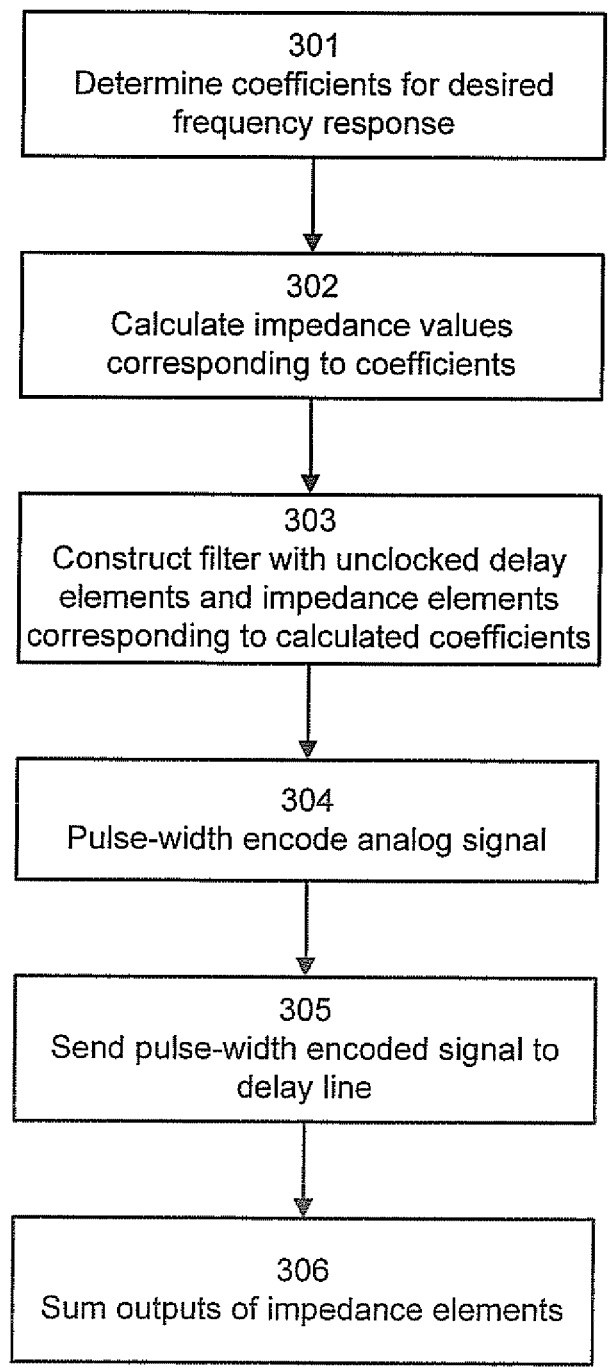
FIG. 3 is a flowchart illustrating one embodiment of a method of filtering an analog signal as described herein.

FIG. 3 is a flowchart of a method of designing a FIR filter with unclocked delay elements, and filtering an analog signal using such a filter, according to one embodiment. At step 301, a set of Fourier coefficients is determined that produces a desired frequency response. The Fourier coefficients may be determined by a designer, or may be the result of a commercially available software program that accepts a desired frequency response as input and provides a set of coefficients as output. One such program is MATLAB© from Math Works™.

At step 302, a set of impedance values corresponding to the Fourier coefficients are calculated, and an impedance value is calculated as the inverse of each coefficient. The impedance values (again typically resistors, although other devices having impedance may be used if desired) may be normalized to a scale that will result in values that are easier to construct if desired; such a technique is well known to those of skill in the art.

At step 303, the filter is constructed using unclocked delay elements for the delay line, and the calculated impedance values for the weighting elements. Again, such to filter might look like the conventional FIR filter of FIG. 1, with the calculated impedance values implemented by resistors R1 to R7, and the delay elements U1 to U7 being unclocked devices such as logic gates.

At step 304, the analog signal is pulse-width encoded by a PWE, such as PWE 202 in FIG. 2. At step 305, the pulse-width encoded signal is sent to the delay line of the filter where, as above, it is sequentially delayed by each delay element and weighted by the resistors attached between the delay elements. The outputs of the resistors are then summed at step 306 to generate the now-filtered analog output signal.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, while resistors have been used for ease of illustration, as noted above inductors, capacitors or other elements having impedance may be used. Still further, while individual resistors providing the desired resistor values are shown herein, this is not required. In some cases a desired resistor value may be easily obtained from a single resistor, while in other cases it may be easier and/or more cost effective to obtain a desired resistor value from some series and/or parallel combination of a plurality of resistors; how to calculate the effective resistance value from individual resistors connected in series and parallel is well understood by those of skill in the art.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. An apparatus for filtering an analog signal, comprising:
   a pulse width encoder configured to receive an analog input signal and convert it into a continuous time puke-width encoded signal;
   a delay line comprising a plurality of unclocked delay elements in series and connected to the pulse-width encoder for propagating the pulse-width encoded signal;
   a plurality of buffers, each buffer in the plurality of buffers coupled to receive the delayed pulse-width encoded signal after the pulse-width encoded signal has passed through a separate one of the plurality of delay elements; and
   a plurality of elements having impedance values, each of the plurality of elements connected to a separate one of the plurality of buffers an impedance value such that the sum of the outputs of the plurality of elements produces a desired frequency response to the pulse-width encoded signal.

2. The apparatus of claim 1 wherein the underclocked delay elements are logic gates.

3. The apparatus of claim 1, wherein the impedance devices are resistors.

4. The apparatus of claim 1, wherein the impedance devices are inductors.

5. The apparatus of claim 1, wherein the impedance devices are capacitors.

6. The apparatus of claim 1, wherein the impedance values of the plurality of elements correspond to a plurality of Fourier coefficients that result in the desired frequency response to the input signal.

7. The apparatus of claim 6 wherein the impedance values of the plurality of elements are the inverse of the Fourier coefficients.

8. The apparatus of claim 1 wherein the impedance values are scaled to a desired range.

9. A method of filtering an analog signal, comprising:
   converting the analog signal into a continuous time pulse-width encoded signal;
   passing the pulse-width encoded signal down a delay line comprising a plurality of unclocked delay elements;
   passing the delayed pulse-width encoded signal through a set of elements having impedance values, a separate element connected to the delay line after each delay element, the impedance values corresponding to a plurality of Fourier coefficients that result in the desired frequency response to the input signal; and
   summing the passed pulse-width encoded signal from each of the elements to obtain an output signal.

\* \* \* \* \*